(12) United States Patent
Fujino et al.

(10) Patent No.: US 9,236,316 B2
(45) Date of Patent: Jan. 12, 2016

(54) SEMICONDUCTOR DEVICE AND METHOD FOR MANUFACTURING THE SAME

(71) Applicant: Mitsubishi Electric Corporation, Tokyo (JP)

(72) Inventors: Junji Fujino, Chiyoda-ku (JP); Yoshihiro Kashiba, Chiyoda-ku (JP); Shohei Ogawa, Chiyoda-ku (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/381,740

(22) PCT Filed: Mar. 21, 2013

(86) PCT No.: PCT/JP2013/058028
§ 371 (c)(1),
(2) Date: Aug. 28, 2014

(87) PCT Pub. No.: WO2013/141287
PCT Pub. Date: Sep. 26, 2013

(65) Prior Publication Data
US 2015/0021750 A1 Jan. 22, 2015

(30) Foreign Application Priority Data

Mar. 22, 2012 (JP) ................................. 2012-065161

(51) Int. Cl.
*H01L 23/043* (2006.01)
*H01L 23/24* (2006.01)
(Continued)

(52) U.S. Cl.
CPC ............ *H01L 23/043* (2013.01); *H01L 21/563* (2013.01); *H01L 23/053* (2013.01);
(Continued)

(58) Field of Classification Search
CPC ....... H01L 23/043; H01L 23/24; H01L 23/36; H01L 23/473; H01L 23/3107; H01L 24/34; H01L 25/072; H01L 25/50; H01L 24/97; H01L 21/563; H01L 23/3121; H01L 23/3675; H01L 23/495; H01L 23/3735; H01L 2224/48091; H01L 2224/48274; H01L 2224/48472
See application file for complete search history.

(56) References Cited

U.S. PATENT DOCUMENTS 3,606,673 A * 9/1971 Overman ........................ 29/827
5,521,437 A * 5/1996 Oshima et al. ................ 257/701
(Continued)

FOREIGN PATENT DOCUMENTS

JP 02-130866 A 5/1990
JP 3-154367 A 7/1991
(Continued)

OTHER PUBLICATIONS

Notification of Transmittal of Translation of the International Preliminary Report on Patentability (Forms PCT/IB/338 and PCT/IB/373) and the Written Opinion of the International Searching Searching Authority (Form PCT/ISA/237) issued on Oct. 2, 2014, by the International Bureau of WIPO in corresponding International Application No. PCT/JP2013/058028. (8 pages).
(Continued)

*Primary Examiner* — Yasser A Abdelaziez
*Assistant Examiner* — Farun Lu
(74) *Attorney, Agent, or Firm* — Buchanan Ingersoll & Rooney PC

(57) ABSTRACT

The present invention has a tray corresponding to a heat sink, a circuit part is accommodated in an accommodating part of the tray, and the circuit part is potting-sealed with a sealing resin such that external electrodes are exposed. The sealing resin covers and seals a top part of the tray.

12 Claims, 12 Drawing Sheets

(51) Int. Cl.
*H01L 23/36* (2006.01)
*H01L 23/473* (2006.01)
*H01L 23/31* (2006.01)
*H01L 23/00* (2006.01)
*H01L 25/07* (2006.01)
*H01L 25/00* (2006.01)
*H01L 21/56* (2006.01)
*H01L 23/367* (2006.01)
*H01L 23/495* (2006.01)
*H01L 23/373* (2006.01)
*H01L 23/053* (2006.01)
*H01L 25/18* (2006.01)
*H01L 23/498* (2006.01)

(52) U.S. Cl.
CPC ............ *H01L 23/24* (2013.01); *H01L 23/3107* (2013.01); *H01L 23/3121* (2013.01); *H01L 23/36* (2013.01); *H01L 23/3675* (2013.01); *H01L 23/3735* (2013.01); *H01L 23/473* (2013.01); *H01L 23/495* (2013.01); *H01L 24/34* (2013.01); *H01L 24/97* (2013.01); *H01L 25/072* (2013.01); *H01L 25/50* (2013.01); *H01L 23/49811* (2013.01); *H01L 25/18* (2013.01); *H01L 2224/40137* (2013.01); *H01L 2224/48091* (2013.01); *H01L 2224/48247* (2013.01); *H01L 2224/48472* (2013.01); *H01L 2224/73221* (2013.01); *H01L 2224/73265* (2013.01); *H01L 2924/1305* (2013.01); *H01L 2924/13055* (2013.01); *H01L 2924/15787* (2013.01)

(56) References Cited

U.S. PATENT DOCUMENTS

| | | | |
|---|---|---|---|
| 2010/0186939 A1 | 7/2010 | Hasegawa | |
| 2010/0263848 A1* | 10/2010 | Aoki | 165/177 |
| 2011/0031612 A1 | 2/2011 | Mitsui et al. | |
| 2012/0112332 A1* | 5/2012 | Minamio et al. | 257/675 |
| 2012/0300522 A1* | 11/2012 | Tokuyama et al. | 363/131 |

FOREIGN PATENT DOCUMENTS

| | | | | |
|---|---|---|---|---|
| JP | 6-188335 A | | 7/1994 | |
| JP | 09-018286 | * | 1/1997 | ............... H03H 9/58 |
| JP | 9-18286 A | | 1/1997 | |
| JP | 9-283681 A | | 10/1997 | |
| JP | 10-22435 A | | 1/1998 | |
| JP | 2004-6905 A | | 1/2004 | |
| JP | 2007-49131 A | | 2/2007 | |
| JP | 2009-212390 A | | 9/2009 | |
| JP | 2010-165716 A | | 7/2010 | |
| KR | 2010-0134766 | | 12/2010 | |

OTHER PUBLICATIONS

International Search Report (PCT/ISA/210) mailed on May 21, 2013, by the Japanese Patent Office as the International Searching Authority for International Application No. PCT/JP2013/058028.

Korean Preliminary Rejection dated Jun. 18, 2015 issued in the corresponding Korean Patent Application No. 2014-7025468 and English translation (9 pages).

Notification of Reason(s) for Refusal dated Sep. 1, 2015 issued by the Japanese Patent Office in Japanese Patent Application No. 2014-506264 (19 pages).

* cited by examiner

SEMICONDUCTOR DEVICE AND METHOD FOR MANUFACTURING THE SAME

TECHNICAL FIELD

The present invention relates to semiconductor devices. More particularly, the present invention relates to semiconductor devices having a power semiconductor element for use in various scenes, such as electric power generation, electric power transmission, efficient energy utilization and regeneration, and relates to methods for manufacturing the same.

BACKGROUND ART

Power modules (power semiconductor devices) have been widely used in various types of products, such as industrial equipment, household electrical appliances, and information terminals. Such power modules to be mounted in household electrical appliances have been particularly required to have reduced sizes and higher reliability. In such power modules, power semiconductor elements incorporated therein are adapted to treat higher voltages and larger electric currents, thereby generating heat, and, therefore, there are provided metal base plates for dissipating the heat. On the other hand, there is a need for securing an insulation distance between the base plate and the electrode terminals for passing higher voltages and larger electric currents therethrough.

Therefore, Patent Document 1 and Patent Document 2 disclose power modules having electrodes placed in an upper surface of the module, a base plate placed in a lower surface opposed thereto, and a circuit part which is sealed by a resin through transfer molding method. By employing this structure, it is possible to reduce the size of the package, in comparison with cases where electrodes are placed in its side surfaces.

Further, at the same time, power modules have been required to have package forms adaptable to SiC semiconductors, which are likely to be a mainstream in the future, due to their higher operating temperatures and excellent operating efficiencies.

PRIOR ART DOCUMENTS

Patent Documents

Patent Document 1: Japanese Patent Laid-open Publication No. H09-283681
Patent Document 2: Japanese Patent Laid-open Publication No. H10-22435
Patent Document 3: Japanese Patent Laid-open Publication No. 2007-49131

SUMMARY OF THE INVENTION

Problems to be Solved by the Invention

In both Patent Document 1 and Patent Document 2, the power modules are formed by sealing operations through transfer molding method, as described above. In this case, in order to certainly expose the electrodes in the upper surface of the power module, it is necessary to position the electrodes with respect to the transfer molding die, with extremely higher accuracy. In order to avoid this problem, there have been proposed a method for making electrodes have a spring property and pressing the electrodes against the aforementioned die, and a method for exposing electrodes outside by bending the electrodes, and the like, after sealing.

However, in the case of pressing the electrodes against the transfer molding die, excessively-larger loads are applied to the root portions of the electrodes, which raises the concern about damages in the substrate and semiconductor elements to which the electrodes are bonded.

Further, in the case of performing processes, such as bending the electrodes after sealing, gaps between the electrodes and the sealing resin, and the like, are induced, which raises the concern about degradations of the quality of the power module due to insulation breakdown and moisture absorption.

Further, Patent Document 3 makes a proposal about a power module structure employing a pail-shaped metal plate. However, Patent Document 3 does not describe about the connection between the metal plate and a cooling device. Furthermore, if they are connected to each other through soldering, this tends to induce softening and deformations of the sealing resin. But Patent Document 3 does not describe countermeasures thereagainst.

Further, the pail-shaped metal plate is described as having side walls with a larger height than that of the sealing resin contained therein, but there is a smaller insulation distance between the electrodes and the side walls since the metal at the top points of the side walls are exposed. This induces the problems of necessity of an electrode-holding housing with excellent insulation property and an increase of the package size. Further, due to the thermal expansion coefficient difference between the side wall and the sealing resin, they tend to be exfoliated from each other, thereby inducing the problem of degradations of the insulation property over time.

As described above, the power module in Patent Document 3 also has the problem of quality degradations.

The present invention is made to overcome the aforementioned problems, and it is an object of the present invention to provide a semiconductor device capable of preventing damages of structural portions in the semiconductor device and degradations of the quality of the semiconductor device, and a method for manufacturing the same.

Solutions to the Problems

In order to overcome the aforementioned object, there is provided a structure as follows, according to the present invention.

Namely, a semiconductor device in one aspect of the present invention comprises a tray configured to have an accommodating part with a concave shape, a circuit part configured to be housed in the accommodating part and have a semiconductor element and wiring members, and a sealing resin configured to be injected in the accommodating part and seal, in potting, the circuit part housed in the accommodating part and side wall top parts of the tray; the wiring members being partially exposed out of an upper surface of the sealing resin to form external electrodes, and the sealing resin having a heat resistant temperature which is higher than the melting point of a solder for bonding the tray to a cooling device.

Effects of the Invention

With the semiconductor device in one aspect of the present invention, the sealing resin is injected into the accommodating part in the tray which houses the circuit part, such that the external electrodes are exposed, so that the circuit part is potting-sealed. This enables fabrication of the semiconductor device such that the external electrodes are exposed out of the upper surface of the sealing resin. In this case, transfer molding method is not employed, which prevents the semiconductor element and the substrate from being subjected to stresses and from being damaged. Further, the external electrodes are preliminarily exposed, and the external electrodes are not subjected to processes such as bending, after the sealing, which also prevents the occurrence of degradations of the quality of the semiconductor device. Further, the sealing resin has such a heat resistant property that its heat resistant temperature is higher than that of the solder used for bonding the tray and the cooling device to each other, which enables suppressing strength degradations and withstand-voltage degradations caused by thermal softening and deformations of the sealing resin due to thermal history of the soldering.

Further, the sealing resin is formed to have a larger height than that of the tray, the side wall top parts of the metal tray are covered with the sealing resin, and a tray side wall near an electrode for larger electric currents is formed to have a smaller height than those of the other tray side walls. This enables securing a larger insulation distance between the metal tray and the electrodes. This eliminates the necessity of providing a housing, thereby suppressing package size increases.

EMBODIMENTS OF THE INVENTION

Figure 1:
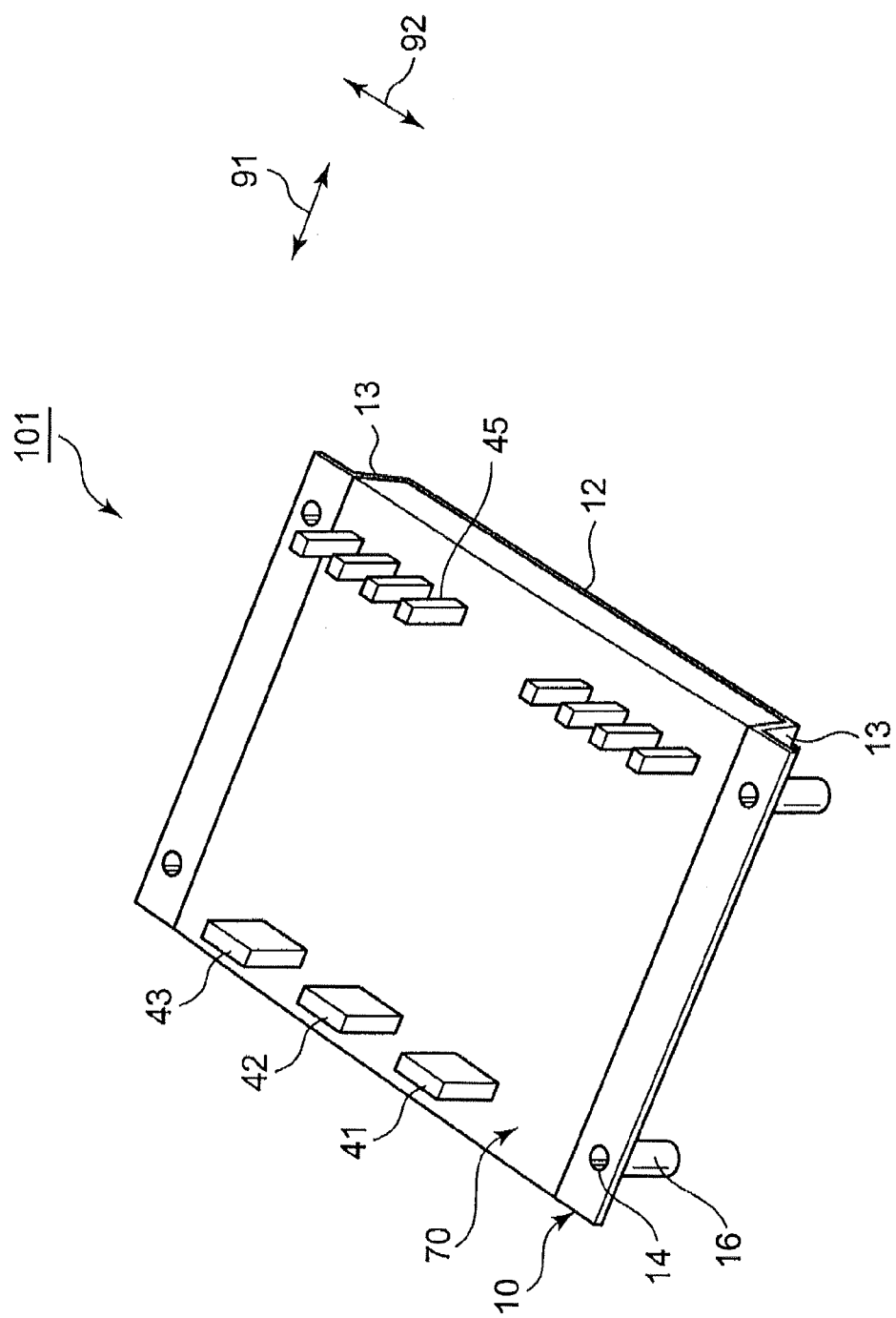
FIG. 1 is a perspective view illustrating a semiconductor device according to a first embodiment of the present invention.
Figure 2:
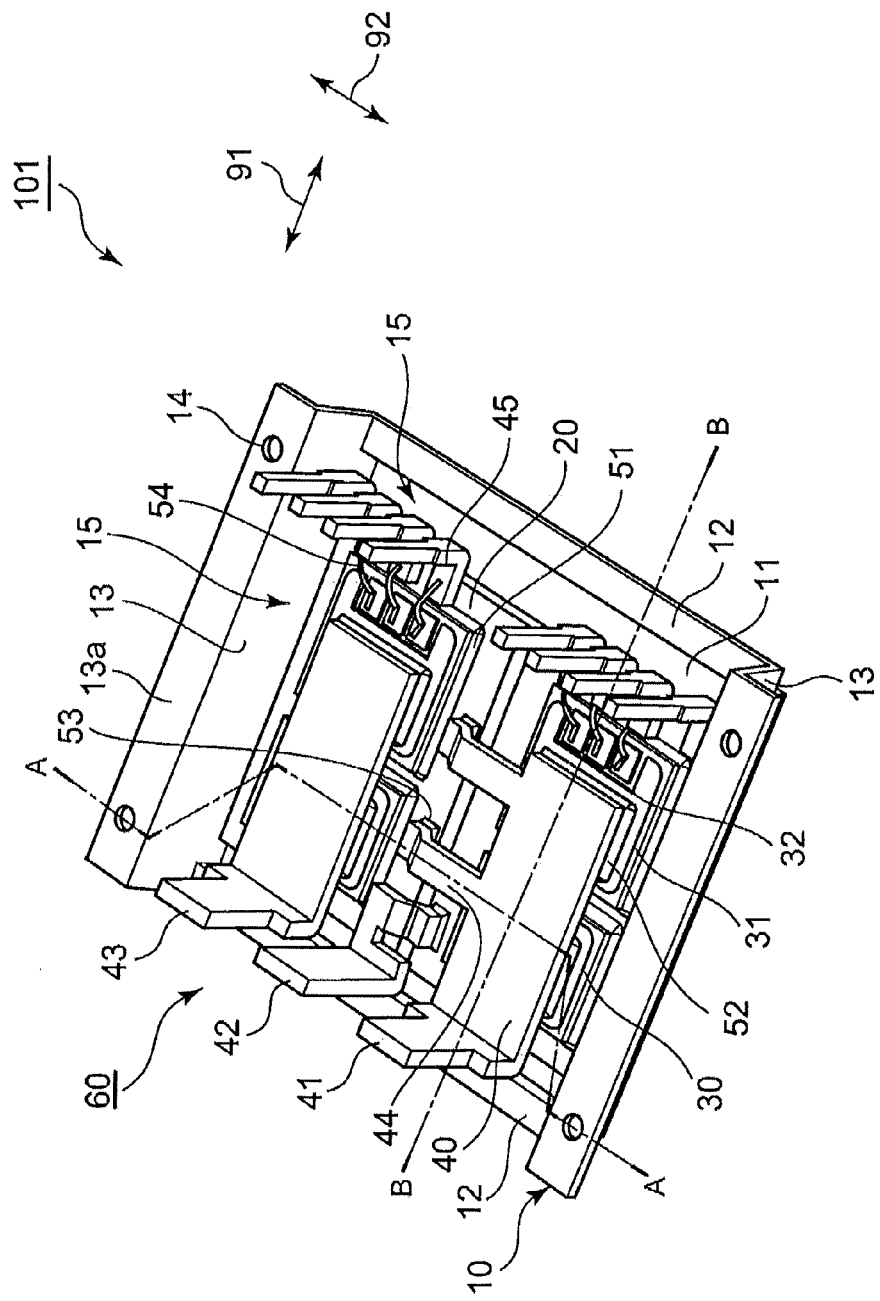
FIG. 2 is a perspective view of the semiconductor device, illustrating a state where a sealing resin is omitted from the semiconductor device illustrated in FIG. 1.

Hereinafter, a semiconductor device and a method for manufacturing the same according to an embodiment of the present technique will be described, with reference to the drawings. Further, throughout the drawings, the same or similar structural portions are designated by the same reference characters. Further, matters which have been already well known may not be described in detail, and structures which are substantially the same may not be described redundantly, in some cases, in order to prevent the following descriptions from being unnecessarily redundant, for allowing those skilled in the art to easily understand them. Further, the contents of the following descriptions and the accompanying drawings are not intended to restrict the subjects defined in the claims.

First Embodiment

With reference to FIGS. 1 to 4, a semiconductor device 101 according to a first embodiment of the present invention will be described. In this case, as the semiconductor device 101, there will be exemplified a power module (power semiconductor device) which is adapted to treat higher voltages (about 200 V to about 1200 V) and larger electric currents (about 100 A to about 800 A). However, the semiconductor device 101 is not limited thereto and can be any semiconductor device adapted to treat normal voltages and electric currents rather than higher voltages and larger electric currents.

The semiconductor device 101 according to the present first embodiment includes a tray 10, a circuit part 60, and a sealing resin 70, as basic structural portions.

The tray 10 is fabricated to have a concave-type tray shape by pressing an aluminum plate with a thickness of 1 mm, for example, in the present embodiment. The tray 10 has a bottom surface 11, low side walls 12 with a smaller height, and high side walls 13 with a larger height. The bottom surface 11, the low side walls 12, and the high side walls 13 form a concave-type accommodating part 15 for housing the circuit part 60.

The high side walls 13, which form the accommodating part 15, are a pair of side walls extending in a first direction 91 in such a way as to oppose each other and, further, are side walls with a larger height than that of the low side walls 12. Further, the high side walls 13 are folded, at their respective upper end portions, to form flange portions 13a, and the flange portions 13a are provided with through holes 14 which penetrate these flange portions 13a at their opposite end portions in the first direction 91.

Further, the low side walls 12, which form the accommodating part 15, are placed in such a way as to oppose each other between the high side walls 13, along a second direction 92 orthogonal to the first direction 91. Further, the low side walls 12 are side walls formed to have a smaller height than that of the high side walls 13.

The circuit part 60 includes semiconductor elements and wiring members. In the present embodiment, the semiconductor elements include diodes 30 and IGBTs (Insulated Gate Bipolar Transistor) 31, and the wiring members include bus bars 40, external electrodes 41 to 43, leads 44, signal electrodes 45, solders and the like. The circuit part 60 will be further described, in more detail.

A heat sink 20 made of Cu is mounted on the bottom surface 11 of the tray 10, with an insulation sheet 55 interposed therebetween, and the diodes 30 and the IGBTs 31 are bonded thereon through a solder 51. The bus bars 40 made of Cu are placed on the active surfaces of the diodes 30 and the IGBTs 31 and, further, are bonded thereto through a solder 52. Portions of the bus bars 40 are drawn in the thickness direction 101a (FIG. 3) of the semiconductor device 101 to form the external electrodes 41 and 43. Further, other portions of the bus bars 40 are bonded to the heat sink 20 through a solder 53 to form the leads 44. The external electrode 42 is bonded to the heat sink 20. Further, wirebonds 54 extending from a gate electrode 32 and the like in the IGBTs 31 are bonded to the signal electrodes 45.

Further, in the circuit part 60, particularly, the external electrodes 41 and 43, which correspond to power electrodes which are connected to the IGBTs 31 and adapted to treat higher voltages and larger electric currents, are placed near one of the low side walls 12 forming the accommodating part 15 in the tray 10. Since the tray 10 is provided with the low side walls 12 and, also, the power electrodes are associated with the low side walls 12, as described above, it is possible to secure a creepage distance of insulation between the power electrodes and the metal tray 10 or the low side walls 12, thereby attaining excellent insulation.

The circuit part 60 having this structure is housed in the accommodating part 15 in the tray 10 with the insulation sheet 55 interposed therebetween, as described above. Thereafter, a silicone gel 71 which is to form the sealing resin 70 is injected into the accommodating part 15, thereby sealing the circuit part 60. Further, thereon, a potting sealing agent 72 which is also to form the sealing resin 70 is charged into the entire accommodating part 15.

Figure 3:
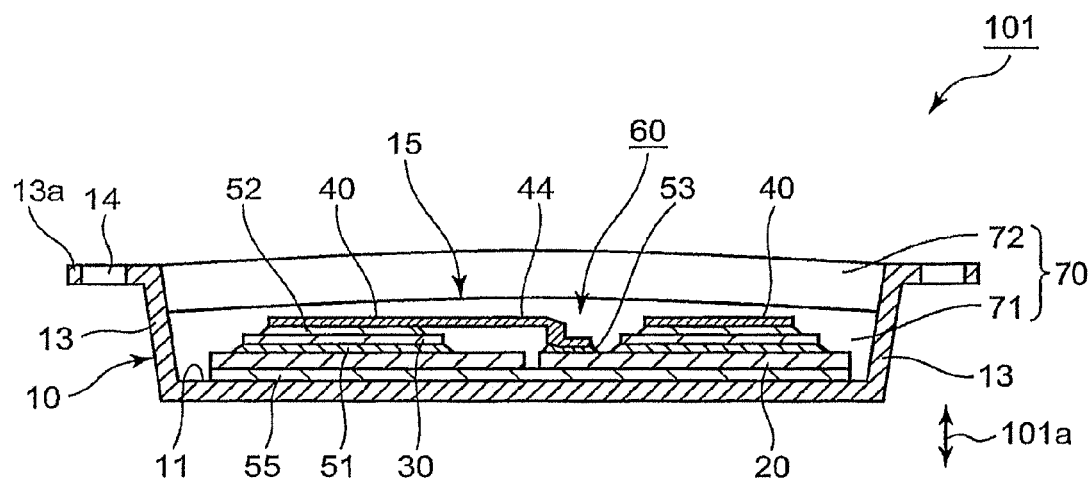
FIG. 3 is a cross-sectional view taken along the A-A part illustrated in FIG. 2.
Figure 4:
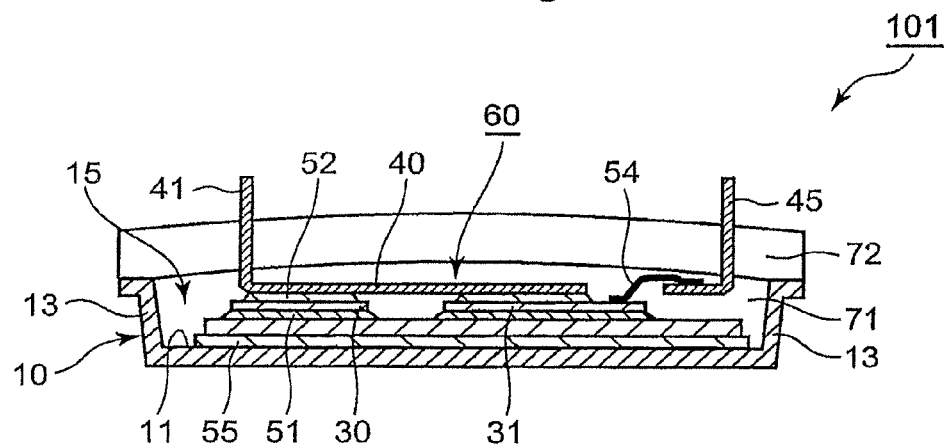
FIG. 4 is a cross-sectional view taken along the B-B part illustrated in FIG. 2.

In this case, the potting sealing resin 72 can be injected into the accommodating part 15 such that it substantially conforms to the height of the flange portions 13a which correspond to the top parts of the high side walls 13 in the tray 10 as illustrated in FIG. 3, for example. Also, the potting sealing resin 72 can be injected into the accommodating part 15 such that it overlies the flange portions 13a and exceeds the height of the flange portions 13a, as illustrated in FIG. 4. In the case where the potting sealing resin 72 is placed such that it overlies the flange portions 13a, as illustrated in FIG. 4, it is possible to secure higher insulation between the flange portions 13a and the external electrodes 41, etc.

Through the sealing as described above, the external electrodes 41 to 43, and the signal electrodes 45 are exposed out of the surface of the potting sealing agent 72, as illustrated in FIG. 1. Further, pipe-type spacers 16 are adhered thereto in such a way as to align with the through holes 14 in the tray 10, which enables passing screws through the through holes 14 and the spacers 16 for securing the tray 10 having the circuit part 60.

As described above, in the semiconductor device 101, the circuit part 60 housed in the accommodating part 15 in the tray 10 is potting-sealed by the sealing resin 70 and, at this time, the external electrodes 41 to 43 and the signal electrodes 45 have been drawn such that they are exposed out of the surface of the sealing resin 70.

Accordingly, with the semiconductor device 101, the electrodes are not in the form of being pressed at the time of sealing and, therefore, there is no possibility of damages of the substrate and the semiconductor elements, to which the electrodes are bonded, and, further, since there is no need for performing processes on the electrodes after the sealing, which eliminates the possibility of degradations of the quality of the semiconductor device, due to insulation breakdown and moisture absorption.

In the aforementioned embodiment, the heat sink 20 for mounting the semiconductor elements such as the IGBTs 31 thereon is made of Cu, but it is also possible to employ other metals such as Al or ceramic substrates made of AlN and the like, which can also provide the same effects as those provided by Cu.

Further, although the bus bars 40 and the external electrodes 41, etc. are made of Cu, it is also possible to employ Ni—Fe alloys and Al, which can also provide the same effects as those provided by Cu.

Further, the external electrodes 41 to 43 and the signal electrodes 45 can be also formed from spring terminals or press-fit terminals, instead of Cu plate members. This structure can also provide the same effects as those provided by Cu plate members.

Further, although, in the aforementioned embodiment, the tray 10 is formed from an Al plate, it is also possible to employ, thereas, metal trays made of Cu, Fe—Ni alloys or stainless steels, which can also provide the same effects as those provided by Al. Further, in cases of employing power elements with smaller amounts of heat generation, or normal elements, as the semiconductor elements, it is also possible to employ a resin tray made of a fluorocarbon resin, PET or the like, which can also provide the same effects as those provided by Al.

Further, the metal tray 10 can be also made of a solderable material, such as Cu, Ni, tin plates (Sn-plated steels) and, also, solderable metallization can be applied to the surface of the material such as Al, which enables soldering the tray 10 to a cooling device, thereby further improving the reliability.

In the case of soldering the tray 10 to a cooling device, as described above, the sealing resin 70 should have a heat-resistant temperature which is higher than the melting point of the solder at the soldering portions.

Further, in the aforementioned embodiment, the silicone gel 71 and the potting sealing agent 72 are employed as the sealing resin 70, but the present embodiment is not limited thereto, and the silicone gel 71 can be eliminated by using a potting sealing resin with higher permeability, which can also provide the same effects.

Figure 5:
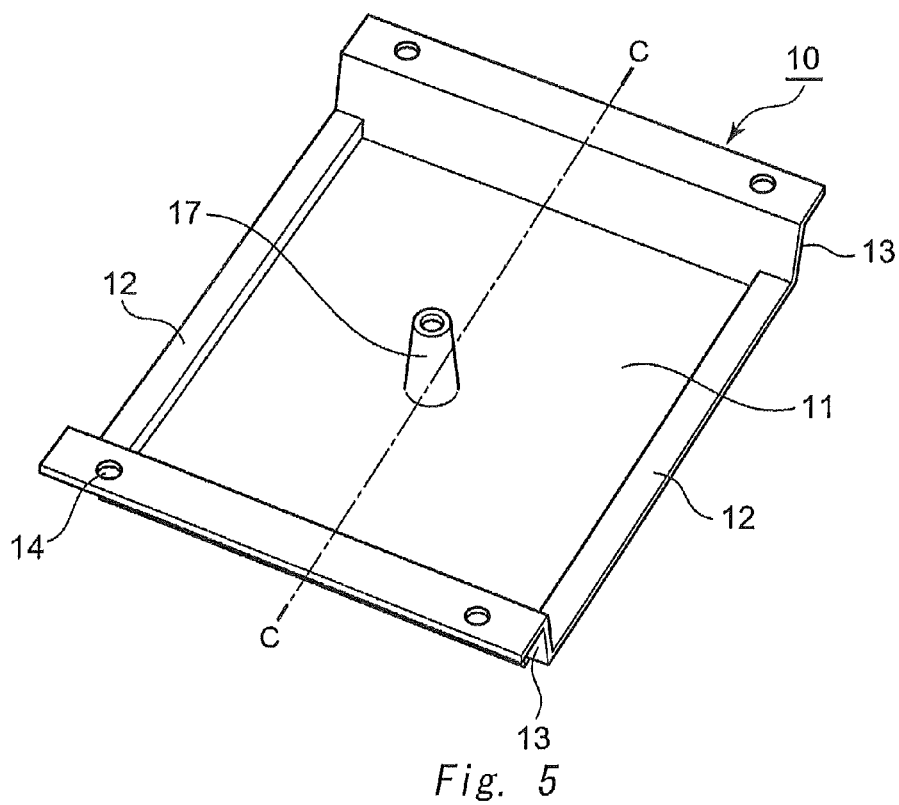
FIG. 5 is a perspective view illustrating an example of modification of a tray included in the semiconductor device illustrated in FIG. 1.
Figure 6:
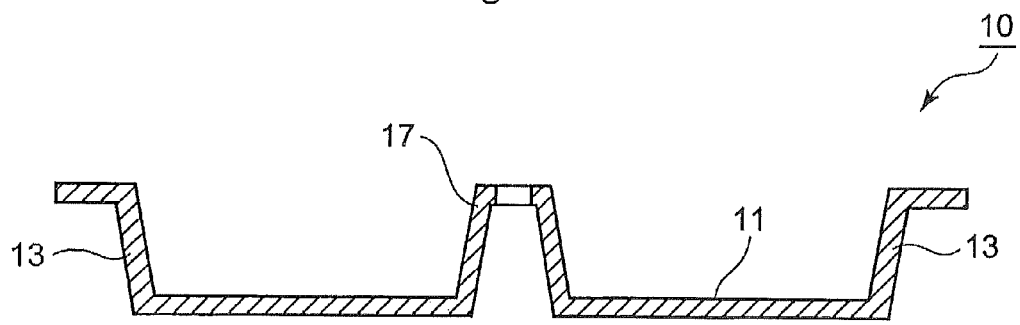
FIG. 6 is a cross-sectional view taken along the C-C part illustrated in FIG. 5.
Figure 7:
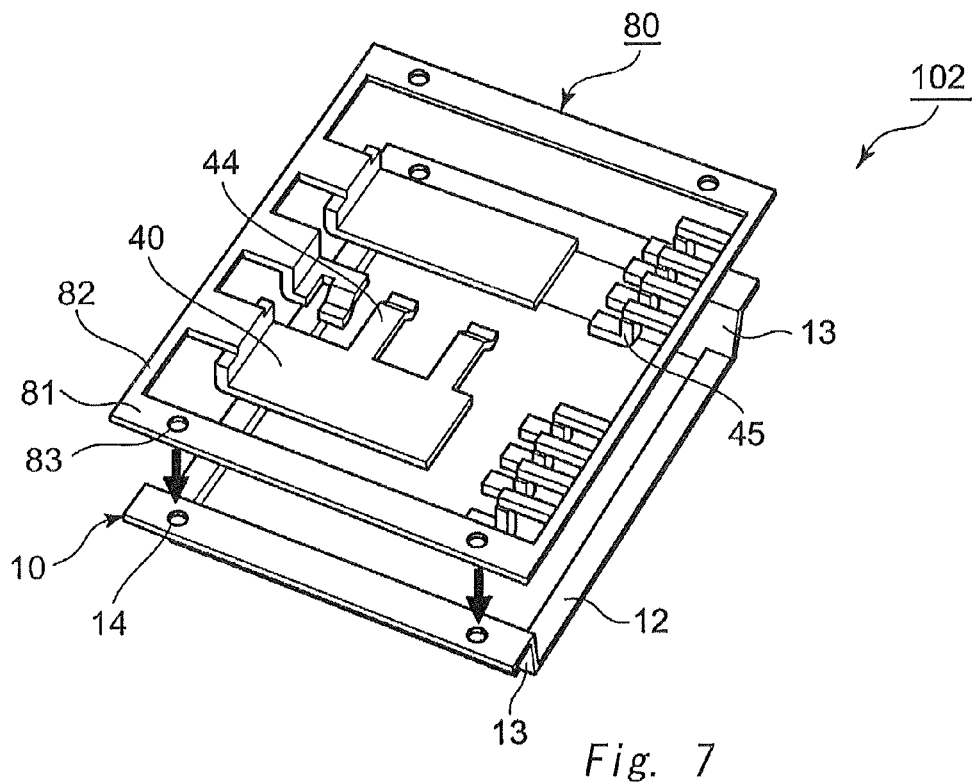
FIG. 7 is a perspective view illustrating a portion of the structure of a semiconductor device according to a second embodiment of the present invention, more specifically illustrating a tray and a lead frame.

Also, as illustrated in FIG. 5, a tubular-shaped protrusion 17 can be formed at a portion of the bottom surface 11 of the tray 10. When the semiconductor device 101 having been potting-sealed is incorporated in an apparatus, this protrusion 17 can be utilized as an opening portion for securing it with a screw. Accordingly, when the semiconductor device 101 is incorporated in the apparatus, it is possible to certainly fix it, thereby improving the reliability.

Second Embodiment

In the aforementioned first embodiment, the bus bars 40, the signal electrodes 45 and the like are constituted by respective individual members. However, in a semiconductor device 102 according to the present second embodiment, they are formed integrally with a lead frame 80, with a frame 81 and tie bars 82 which form the lead frame 80. The other structures are not changed from the structures of the aforementioned semiconductor device 101.

The lead frame 80 is provided with opening portions 83, which enables positioning the lead frame 80 with respect to a tray 10 using through holes 14 in the tray 10.

In the case of using this lead frame 80, in the state where the lead frame 80 is mounted to the tray 10, predetermined portions such as the bus bars 40 in the lead frame 80 are soldered to the active surfaces of the diodes 30 and the IGBTs 31 which have been bonded through soldering to a heat sink 20 provided in an accommodating part 15 in the tray 10.

Figure 8:
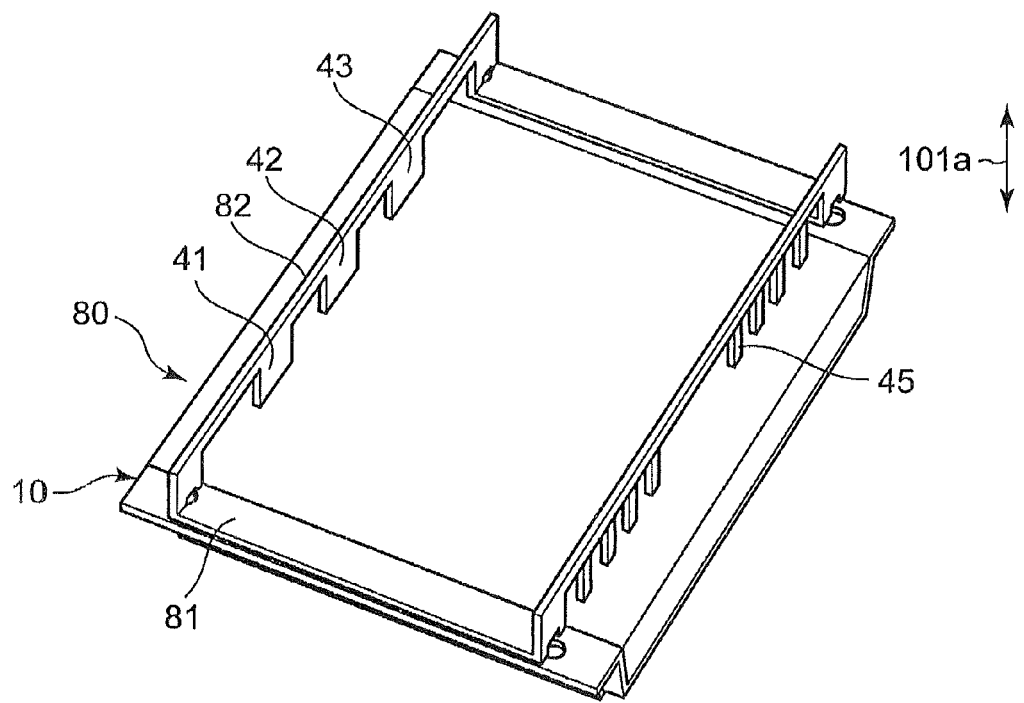
FIG. 8 is a perspective view illustrating a state where tie bars in the lead frame have been folded, in the semiconductor device illustrated in FIG. 7.

Thereafter, as illustrated in FIG. 8, in the lead frame 80, the portions of the tie bars 82 having the external electrodes 41 to 43 and signal electrodes 45 are folded along a thickwise direction 101*a*.

After the folding, the accommodating part 15 is potting-sealed through the sealing resin 70 together with the circuit part 60 and the portions of the bus bars 40 and the like in the lead frame 80, as described above.

Further, after the sealing, the tie bars 82 are cut apart from the external electrodes 41 to 43 and the signal electrodes 45, which enables formation of the individual electrodes as the external electrodes 41 to 43 and the signal electrodes 45.

With the semiconductor device 102 according to the second embodiment, it is also possible to provide the aforementioned effects provided by the semiconductor device 101 according to the first embodiment. Further, in the semiconductor device 101 since it is possible to collectively place the electrodes with respect to semiconductor elements and the like by employing the lead frame 80, the semiconductor device 101 can improve the productivity of the semiconductor device and can also improve the accuracy of the positioning of the respective electrodes.

Third Embodiment

Figure 9:
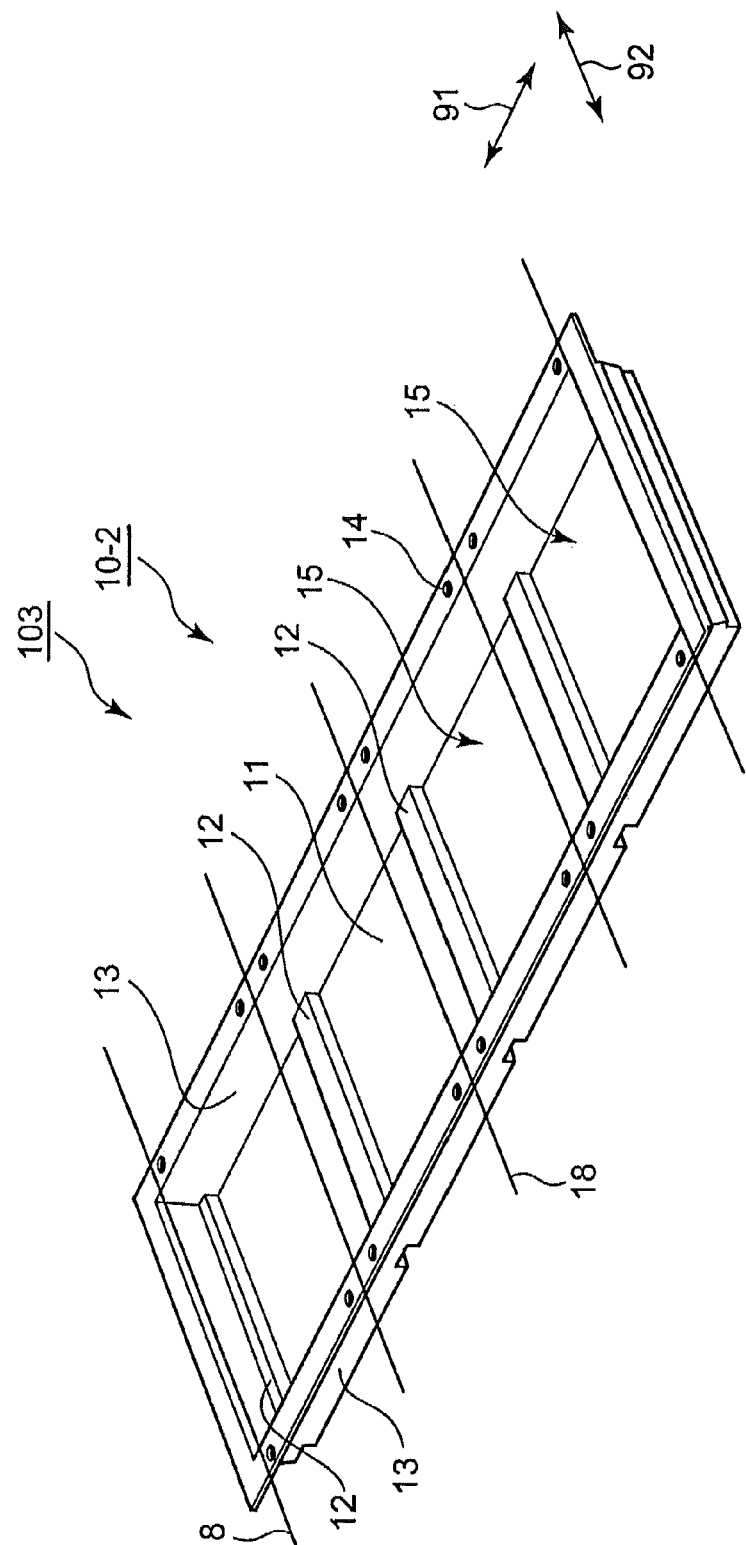
FIG. 9 is a perspective view illustrating a portion of the structure of a semiconductor device according to a third embodiment of the present invention, more specifically illustrating a multiple-piece tray.

In the aforementioned respective embodiments, there have been disclosed aspects where the single tray 10 is provided with the single accommodating part 15. In a semiconductor device 103 according to the third embodiment, as illustrated in FIG. 9, a single tray 10-2 is structured to accommodate a plurality of circuit parts 60, namely a plurality of accommodating parts 15, in such a way as to juxtapose them along the first direction 91. Namely, in the multiple-piece tray 10-2, each of the high side walls 13 has a length in which the plural circuit parts 60 can be accommodated in such a way as to juxtapose them along the first direction 91. Further, the tray 10-2 includes low side walls 12 which are placed in the bottom surface 11 of the tray 10-2 at plural portions in the first direction 91 in such a way as to oppose each other. In the third embodiment, the low side walls 12 are fabricated by pressing the bottom surface 11 in a convex shape.

Further, in FIG. 9, the tray 10-2 is illustrated as being capable of housing four circuit parts 60, namely having four accommodating parts 15, but the number of circuit parts which can be housed therein is not limited to four and can be two or more.

In the single tray 10-2 having this structure, the aforementioned circuit parts 60 are housed in the respective accommodating parts 15 and, they are collectively potting-sealed with a sealing resin 70, through the aforementioned method. In this embodiment, the structure of each circuit part 60, and the placement relationship between the aforementioned power electrodes in the circuit parts 60 and the low side walls 12 in the tray 10-2 are the same as those in the aforementioned case and, further, the method for potting sealing for the circuit parts 60 is also the same as that in the aforementioned case. Namely, the semiconductor device 103 according to the third embodiment is the same as the semiconductor device 101 according to the first embodiment in the other structures, namely except that the configuration of the tray 10-2 is different from that of the tray 10.

After the sealing, the tray 10-2 is cut at cutting portions 18 which are positioned in such a way as to align with the low side walls 12 and along the second direction 92. Though the cutting, the single tray 10-2 is divided into the plurality of individual circuit parts 60.

With the semiconductor device 103 according to the third embodiment, it is also possible to provide the aforementioned effects provided by the semiconductor device 101 according to the first embodiment. Since the semiconductor device 103 according to the third embodiment further employs the multiple-piece tray 10-2, it is possible to improve the productivity of the semiconductor device. Further, since the low side walls 12 are formed by pressing the continuous flattened bottom surface 11, it is possible to easily fabricate the low side walls 12 in comparison with cases of forming the individual low side walls 12, as in the tray 10. This also makes it easier to optimize the height of the low side walls 12. Therefore, this also provides the advantage of ease of securing a creepage distance of insulation between the power electrodes and the low side walls 12.

Further, it is also possible to apply the respective examples of modifications which have been described in the first embodiment to the semiconductor device 103 according to the third embodiment and, further, it is also possible to apply, thereto, the structure according to the second embodiment. Further, in the case of applying the structure according to the second embodiment to the semiconductor device 103, the operation for cutting the tie bars 82 apart from the external electrodes 41 to 43 and the signal electrodes 45 after sealing can be performed either before or after the aforementioned division into the individual parts.

Further, in a case that a plurality of trays can be also used in the state of being coupled to each other without being cut away from each other, and the external electrodes 41 to 43 and the like can be placed in such a way as to straddle the plural trays, this can contribute to an increase of the capacity of the power semiconductor device due to the use of juxtaposed power semiconductor elements, and further can contribute to assemblability improvement and size reduction due to the sharing of electrode terminals.

Fourth Embodiment

FIGS. 10A to 10D, and FIGS. 11A and 11B illustrate schematic views of a semiconductor device 104 according to a fourth embodiment of the present invention. The semiconductor device 104 according to the fourth embodiment is structured to have the tray 10 having side walls with top parts 10*a* covered with a sealing resin, thereby securing an insulation distance from external electrodes 41 to 43 to the metal tray 10.

Figure 10A:
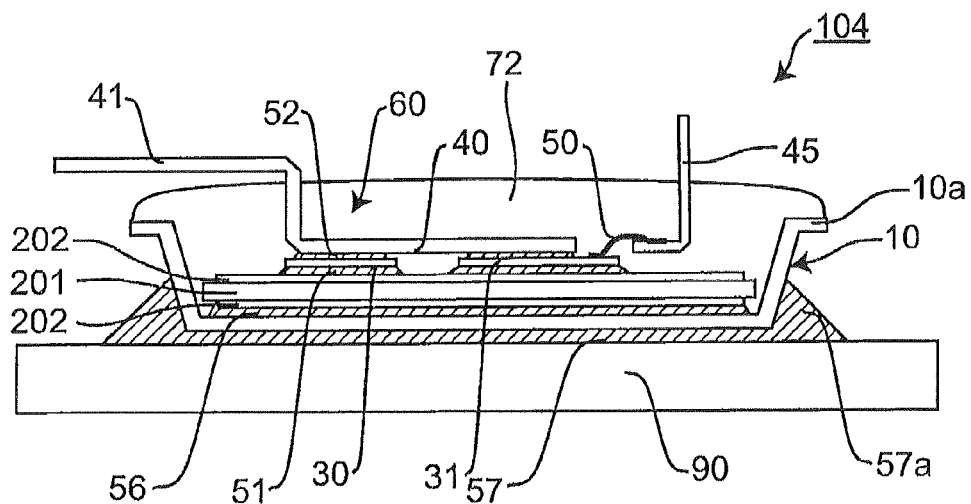
FIG. 10A is a view illustrating an example of the structure of a semiconductor device according to a fourth embodiment of the present invention.

As illustrated in FIG. 10A, a ceramic substrate 201 is bonded to the accommodating part 15 in the metal tray 10 through a soldering portion 56, wherein the ceramic substrate 201 includes a conductive layer 202, and the diodes 30 and the IGBTs 31 which are bonded to the conductive layer 202 through the solder 51. The bus bars 40 are bonded at their one end to the diodes 30 and the IGBTs 31 through the solder 52 and are drawn, at the other end, to the outside to form the external electrodes 41 and 43. Further, wirebonds 50 extending from the gate electrode 32 and the like in the IGBTs are bonded to the signal electrodes 45.

The accommodating part 15 in the tray 10 is sealed by the direct potting sealing resin 72 such that the circuit part 60 is covered therewith and, at this time, it is sealed such that the upper surfaces of the side wall top parts 10a in the tray 10 are covered therewith. In this case, the side wall top parts 10a correspond to the side wall top parts of the high side walls 13, out of the low side walls 12 and the high side walls 13.

Further, this metal tray 10 is bonded to a cooling device 90 through a soldering portion 57. The soldering portion 57 forms a fillet (wet-up) portion 57a with a sufficient height with respect to the low side walls 12 and the high side walls 13 in the tray 10, and it is desirable that the fillet portion 57a wets up to a height of 200% or more of the soldering thickness of the soldering portion 57 on the bottom surface 11 of the tray 10.

Further, due to the order of the aforementioned fabrication processes, the potting sealing resin 72 has a heat-resistant temperature which is higher than the melting point of the solder in the soldering portion 57.

Figure 10B:
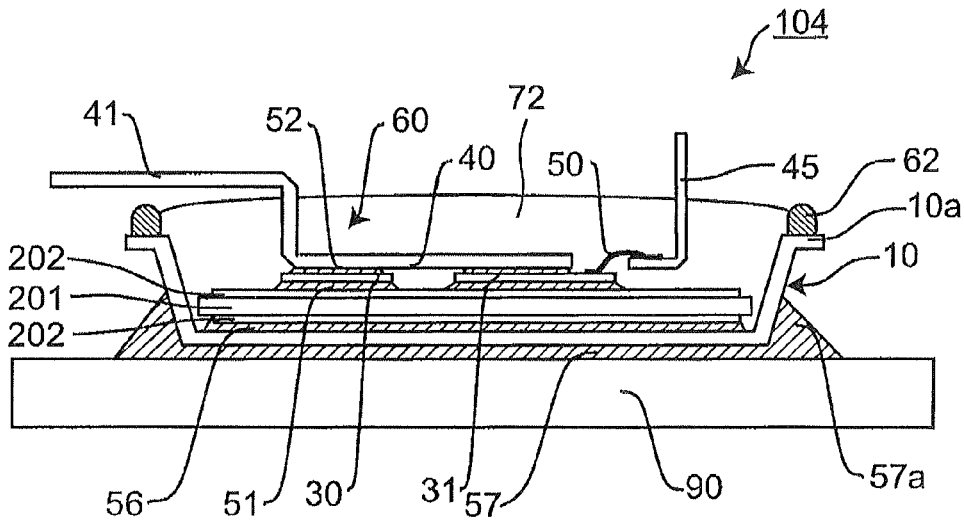
FIG. 10B is a view illustrating another example of the structure of the semiconductor device according to the fourth embodiment of the present invention.

In sealing the accommodating part 15 with the direct potting seating resin 72, as illustrated in FIG. 10B, a dam material 62 made of a metal or a resin can be provided on the upper surfaces of the side wall top parts 10a in the tray 10. By providing the dam material 62, it is possible to increase the height of the high side walls 13 in the tray 10, thereby certainly sealing the side wall top parts 10a.

Figure 10C:
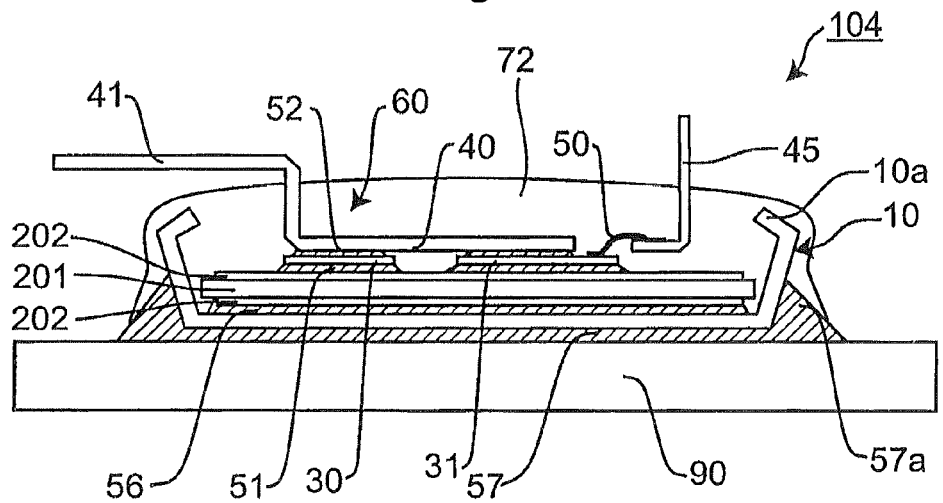
FIG. 10C is a view illustrating yet another example of the structure of the semiconductor device according to the fourth embodiment of the present invention.

Also, as illustrated in FIG. 10C, the side wall top parts 10a in the tray can be folded toward an inner side of the accommodating part 15. By folding the side wall top parts 10a toward the inner side of the accommodating part 15 as described above, it is possible to inject the direct potting sealing resin 72 such that it completely overlies the side wall top parts 10a and further goes beyond the side wall top parts 10a to reach their outer sides. Further, even the solder fillet 57a can be covered with the direct potting sealing resin 72.

With the semiconductor devices illustrated in FIGS. 10A, 10B and 10C, since the circuit part 60 has the same structure as that in the semiconductor device 101 according to the first embodiment, it is possible to provide the effect of preventing damages of the structural portions in the semiconductor device and degradations of the quality of the semiconductor device, which can be provided by the semiconductor device 101 according to the first embodiment. Furthermore, with the semiconductor device 104 according to the fourth embodiment, it is possible to secure an insulation distance between the external electrodes 41 to 43 and the side wall top parts 10a in the tray 10.

Figure 10D:
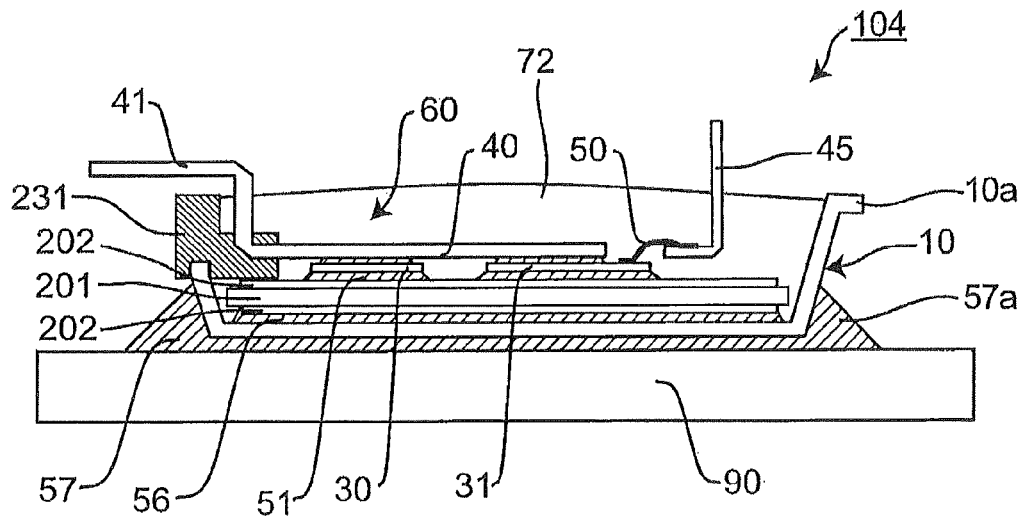
FIG. 10D is a view illustrating yet another example of the structure of the semiconductor device according to the fourth embodiment of the present invention.

Furthermore, as illustrated in FIG. 10D, it is also possible to fabricate an electrode supporting member 411 made of a resin for supporting the external electrode 41 and to place it such that it is fitted to the side wall top part of at least the low side wall 12, out of the low side walls 12 and the high side walls 13 in the metal tray 10. With this structure, it is possible to attain the positioning of the external electrodes 41 to 43 with respect to the tray 10, by injecting the potting sealing resin 72 into the accommodating part 15 in the tray 10 for sealing. Therefore, similarly to in the aforementioned respective embodiments, it is possible to provide the effect of preventing damages of the structural portions in the semiconductor device and degradations of the quality of the semiconductor device and, furthermore, it is possible to secure an insulation distance from the external electrodes 41 to 43 to the tray 10.

Figure 11A:
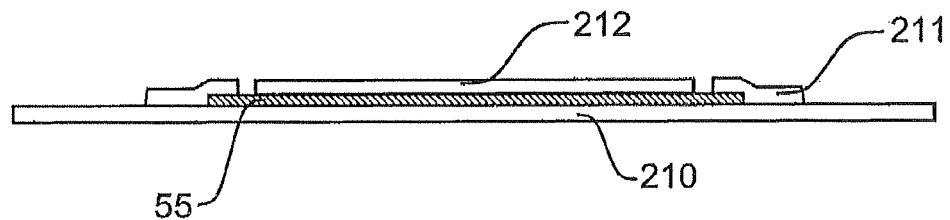
FIG. 11A is a view illustrating a tray in a state where it has not been shaped, the tray included in yet another example of the structure of the semiconductor device according to the fourth embodiment of the present invention.
Figure 11B:
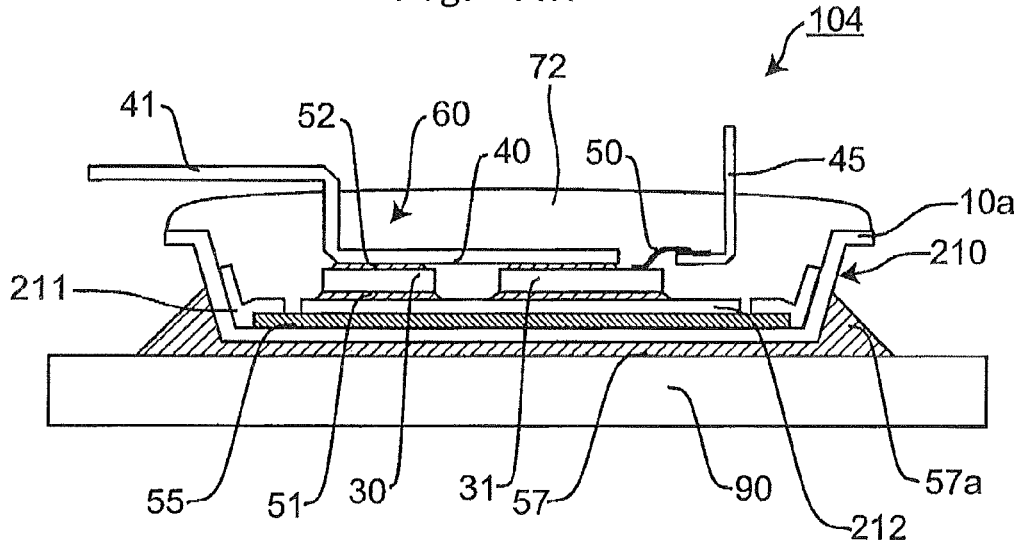
FIG. 11B is a view illustrating the structure of a semiconductor device including a tray in a state where the tray illustrated in FIG. 11A is shaped.

Although the aforementioned structure according to the fourth embodiment has been described as being configured to mount the ceramic substrate 201 and the like on the metal tray 10, it is also possible to form the tray and the substrate integrally with each other, as will be described later. Namely, as illustrated in FIG. 11A, the tray 10 includes a metal base plate 210 which forms the tray, an insulation sheet 55 provided with a metal substrate 212, and claw members 211. In such tray 10, the insulation sheet 55 having the metal substrate 212 is placed on the base plate 210 and is fixed on the base plate 210 with the four peripheral sides of the insulation sheet 55 pinched by the metal claw members 211. The base plate 210 having the insulation sheet 55, the claw members 211, and the metal substrate 212 as described above is folded around the claw members 211 to be shaped into a tray shape, as illustrated in FIG. 11B. After the shaping, as have been already described, the diodes 30, the external electrode 41 and the like are mounted on the metal substrate 212, and the potting sealing resin 72 is injected therein for sealing.

By integrally forming the base plate 210 and the insulation sheet 55 for use as the metal tray 10 as described above, it is possible to attain simplification of the structure and improvement of the reliability thereof. In this case, the insulation sheet 55 is pinched at its outer peripheral portions by the claw members 211, which can suppress deformations and exfoliation of the insulation sheet 55 when the base plate 210 and the claw members 211 are shaped into the tray shape.

Fifth Embodiment

Next, with reference to FIGS. 12A to 12C, a semiconductor device 105 according to a fifth embodiment of the present invention will be described. In the first embodiment and the other embodiments, the external electrodes 41 to 43 are placed near the low side wall 12 of the tray 10 for securing the insulation distance between the metal tray 10 and the external electrodes 41 to 43. On the other hand, in the semiconductor device 105 according to the fifth embodiment, a new tray 215 is employed, and its side walls are folded to secure an insulation distance. This will be described hereinafter in detail.

Figure 12A:
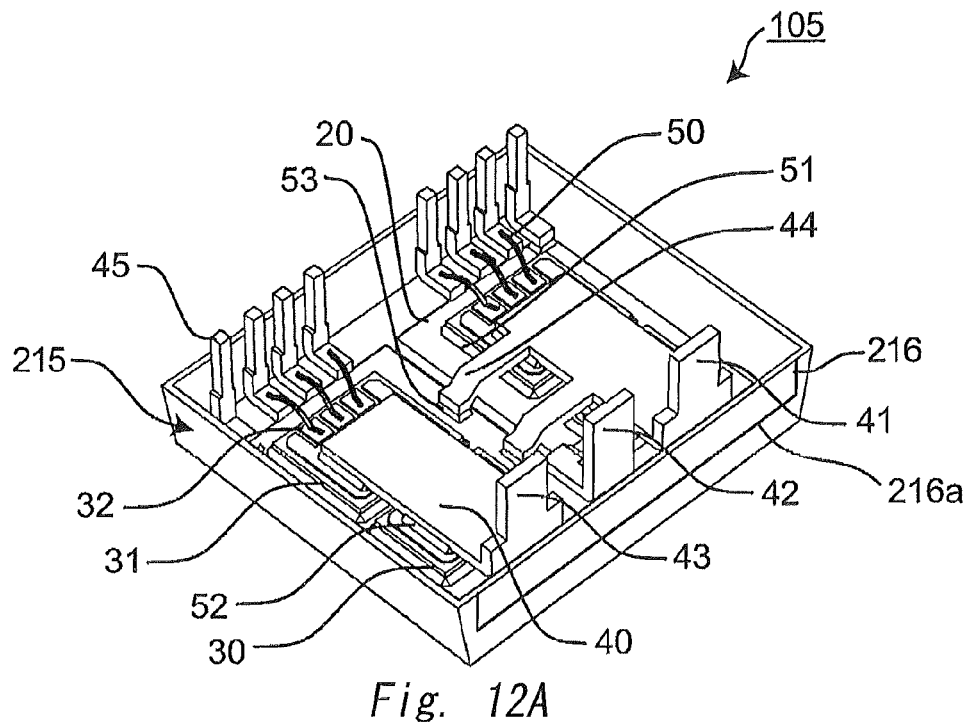
FIG. 12A is a perspective view illustrating the structure of a semiconductor device according to a fifth embodiment of the present invention, in a state where a resin has not been injected therein.
Figure 12B:
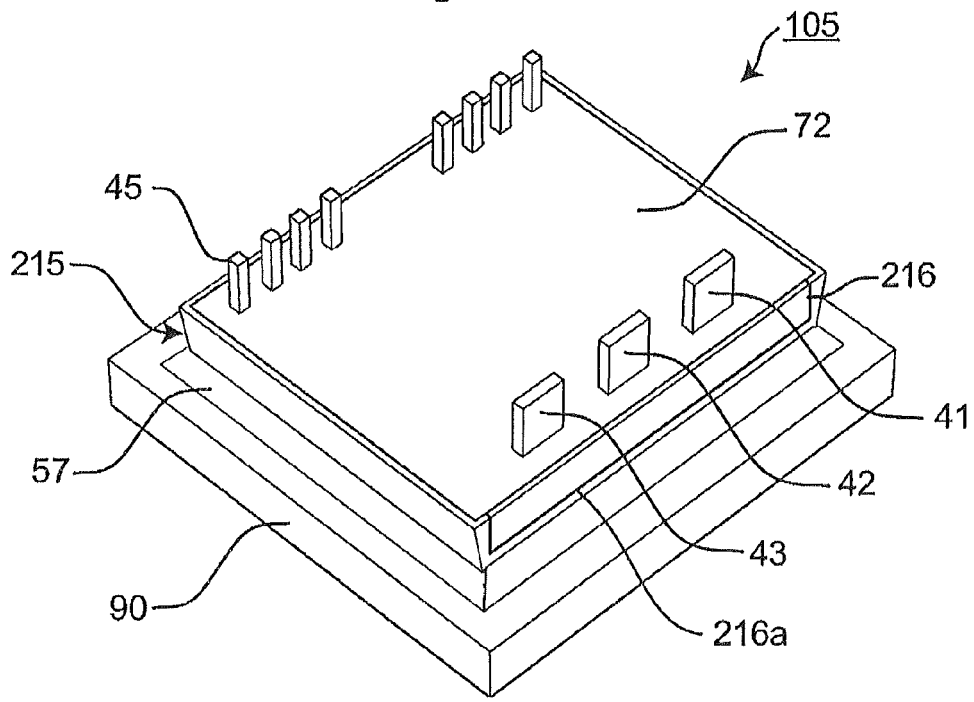
FIG. 12B is a perspective view illustrating the semiconductor device illustrated in FIG. 12A, in a state where a potting-sealing resin has been injected into the tray.

As illustrated in FIG. 12A, the metal tray 215 is made of a thin copper plate with a thickness of 0.5 mm, for example, which has been shaped in a tray shape by pressing. In this case, the respective side walls of the tray 215, which correspond to the four sides thereof, have no variation in their heights and thus, have the same height. Further, a side wall 216 which is proximal to the external electrodes 41 to 43 has a cut line 216a with an angular-U shape, such that it can be folded.

The other structures of the semiconductor device of the fifth embodiment are not changed from the structures described in the first embodiment and the other embodiments. Briefly, the heat sink 20 made of Cu is placed on the tray 215 with the insulation sheet 55 interposed therebetween, and the diodes 30 and the IGBTs 31 are bonded thereon through the solder 51. Further, the bus bars 40 made of Cu are placed on their upper portions and are bonded to the active surfaces of the diodes 30 and the IGBTs 31 through the solder 52. The bus bars 40 are drawn in the vertical direction at a portion thereof to form the external electrodes 41 and 43 and, further, at another portion thereof, are bonded to the heat sink 20 through the solder 53 to form the leads 44. Further, the external electrode 42 is bonded to the heat sink 20. Further, wirebonds 50 extending from the gate electrode 32 and the like in the IGBTs 31 are bonded to the signal electrodes 45. In the circuit part 60 having such structure, as illustrated in FIG.

12B, a potting sealing resin 72 is injected into the circuit part 60 to seal the entirety thereof, which brings the external electrodes 41 to 43 into a state of being exposed out of the potting sealing resin 72. Further, the tray 215 is soldered to the cooling device 90 through the solder 57.

Figure 12C:
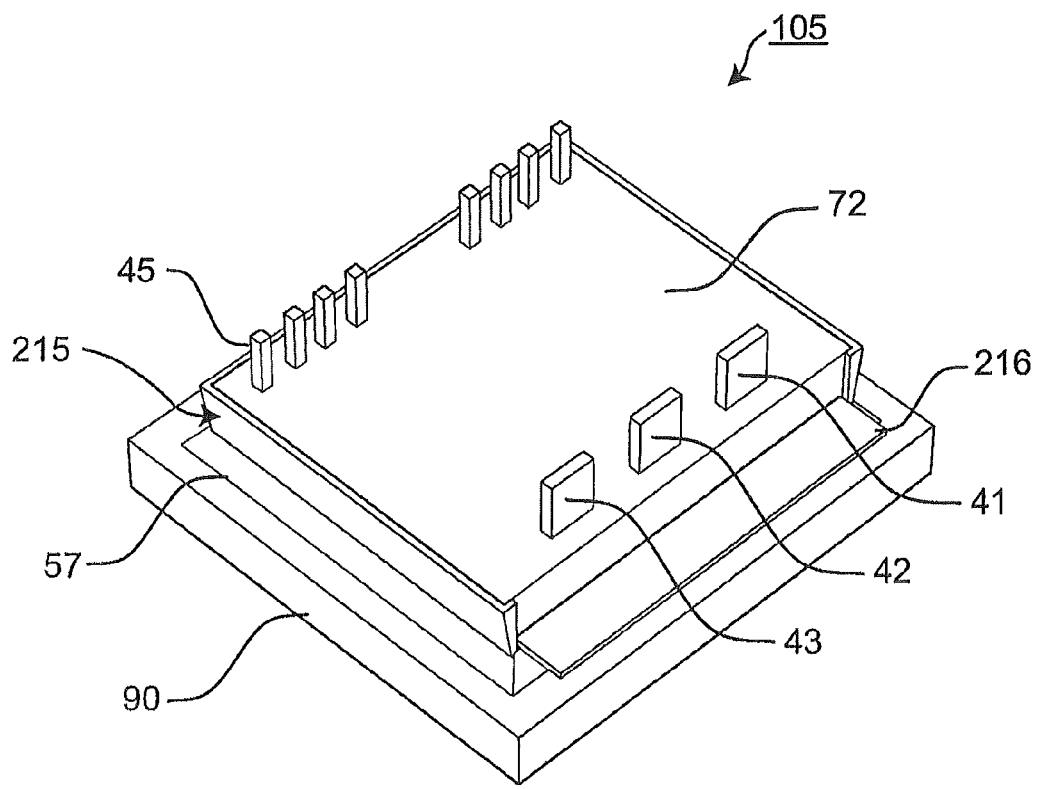
FIG. 12C is a perspective view illustrating the semiconductor device illustrated in FIG. 12B, in a state where a side wall at a portion of the tray has been folded.

After the resin sealing with the potting sealing material 72, as illustrated in FIG. 12C, the side wall 216 in the tray 215, which is positioned near the external electrodes 41 to 43, is folded along the cut line 216a in the outward direction of the tray 215, namely in such a direction that it gets farther away from the external electrodes 41 to 43, thereby completing the fabrication of the semiconductor device 105.

With this structure, it is possible to secure the insulation distance between the external electrodes 41 to 43 and the side wall 216. As a matter of course, with the semiconductor device 105 according to the fifth embodiment, similarly to in the aforementioned respective embodiments, it is possible to provide the effect of preventing damages of the structural portions of the semiconductor device and degradations of the quality of the semiconductor device.

Regarding the side wall 216, it can be also provided with a slit which is narrow enough to prevent leakages of the potting sealing resin 72 therethrough, instead of having the aforementioned cut line 216a. Also, the side wall 216 can be removed along the cut line 216a, after the resin sealing.

Further, the dam material as described in the fourth embodiment can be applied to the side wall top parts of the side walls other than the side wall 216. This enables injecting the potting sealing resin 72 up to a larger height such that it overlies the side wall top parts.

Further, although the tray 215 made of Cu is employed in this embodiment, it is also possible to employ metal materials such as Fe—Ni alloys and tin plates, which can also provide the same effects. Further, in cases of employing power elements with smaller amounts of heat generation, it is also possible to form the side wall 216 in a tray made of a resin, such as a fluorocarbon resin or PET, for example, which can also provide the same effects as those described above. Further, although the heat sink 20 made of Cu is employed, it is also possible to employ other metals such as Al, and ceramic substrates made of AlN and the like, which can also provide the same effects as those described above. Further, although the bus bars 40 and the external electrodes 41 etc. are made of Cu, it is also possible to employ Ni—Fe alloys and Al, which can also provide the same effects.

Further, although the silicone gel and the potting sealing resin 72 are employed in this embodiment, it is also possible to eliminate the silicone gel by employing the potting sealing agent with higher permeability. This can also provide the same effects.

Further, although the external electrode 41 and the signal electrodes 45 are formed from Cu plate members, it is also possible to employ the spring terminals or press-fit terminals thereas, which can also provide the same effects.

Sixth Embodiment

Next, with reference to FIGS. 13A and 13B, a semiconductor device 106 according to a sixth embodiment of the present invention will be described. The semiconductor device 106 according to the present sixth embodiment also employs new trays 220 and 222.

Figure 13A:
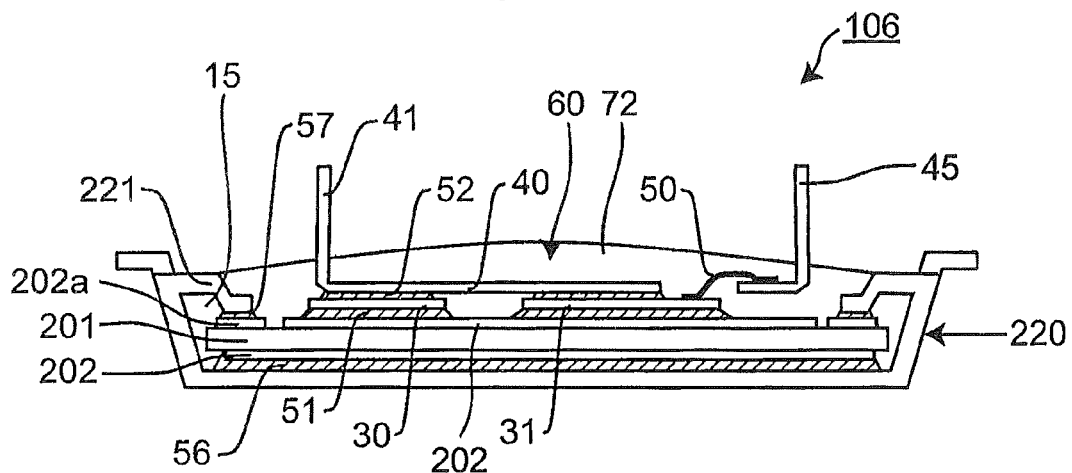
FIG. 13A is a view illustrating an example of the structure of a semiconductor device according to a sixth embodiment of the present invention.

Namely, as illustrated in FIG. 13A, the tray 220 made of a metal has fixing portions 221 protruding toward an inner side of the tray 220 at one or more positions in an upper portion of its peripheral edge portion. Further, the other structures of the semiconductor device in the sixth embodiment are the same as those in the semiconductor device 101 according to the first embodiment, for example.

These fixing portions 221 have functions as follows. Namely, after the ceramic substrate 201 on which the circuit part 60 has been formed, for example, is mounted in the accommodating part 15 in the tray 220, the fixing portions 221 are folded inwardly and are fixed through soldering to an independent conductive layer 202a which has been formed on the surface of the ceramic substrate 201. Here, the independent conductive layer 202a is an independent conductive layer which is not electrically connected to the conductive layer 202 which is similarly formed on the ceramic substrate 201 and has the IGBTs 31 and the like which are soldered thereon.

By providing the fixing portions 221 and connecting them to the conductive layer 202a, it is possible to reinforce the bonding between the tray 220 and the ceramic substrate 201. Therefore, it is possible to provide the effect of preventing damages of the structural portions in the semiconductor device and degradations of the quality of the semiconductor device, similarly to in the aforementioned respective embodiments.

Figure 13B:
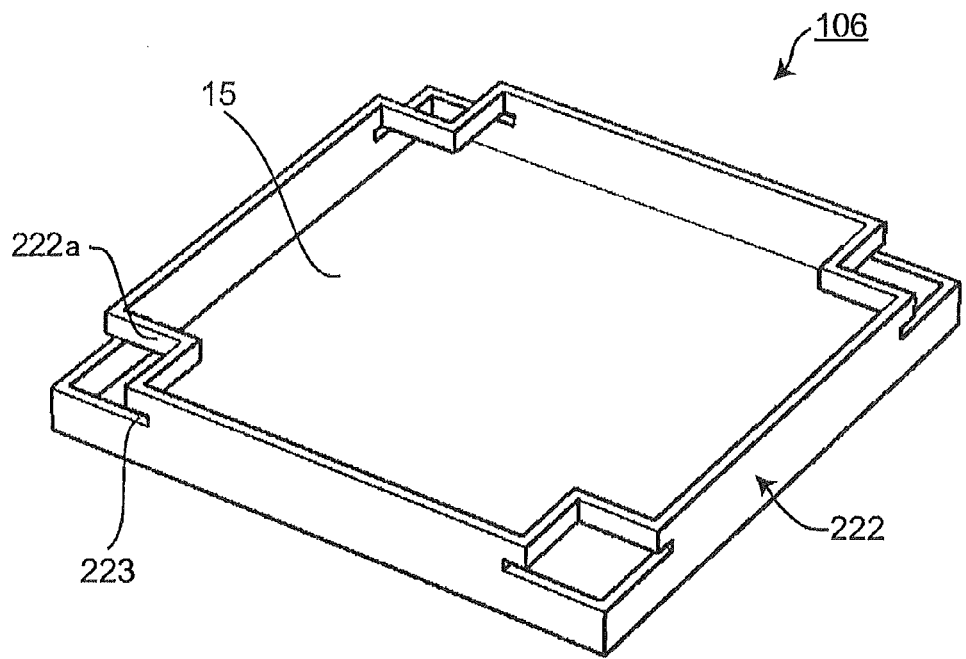
FIG. 13B is a perspective view illustrating a tray included in the structure of the semiconductor device according to the sixth embodiment of the present invention, in another example.

Also, as a similar structure to the semiconductor device, it is possible to employ the tray 222 made of a metal, as illustrated in FIG. 13B. The tray 222 is provided with horizontal slits 223 at its four corners and, further, includes folded portions 222a which are formed by inwardly folding the respective corner portions of the tray 222. Here, the folded portions 222a correspond to an example of the fixing portions and, further, the method for forming the folded potions 222a is not limited to the above method. These folded portions 222a can be connected to the conductive layer 202a, similarly to the aforementioned fixing portions 221, which can reinforce the bonding between the tray 220 and the ceramic substrate 201. Therefore, it is possible to provide the effect of preventing damages of the structural portions in the semiconductor device and degradations of the quality of the semiconductor device, similarly to in the aforementioned respective embodiments.

Seventh Embodiment

Next, with reference to FIGS. 14A and 14B, a semiconductor device 107 according to a seventh embodiment of the present invention will be described. The semiconductor device 107 according to the present seventh embodiment also employs a new tray 225. Further, the circuit part 60 mounted in the accommodating part 15 in the tray 225 is the same as those in the aforementioned respective embodiments and will not be described here.

Figure 14A:
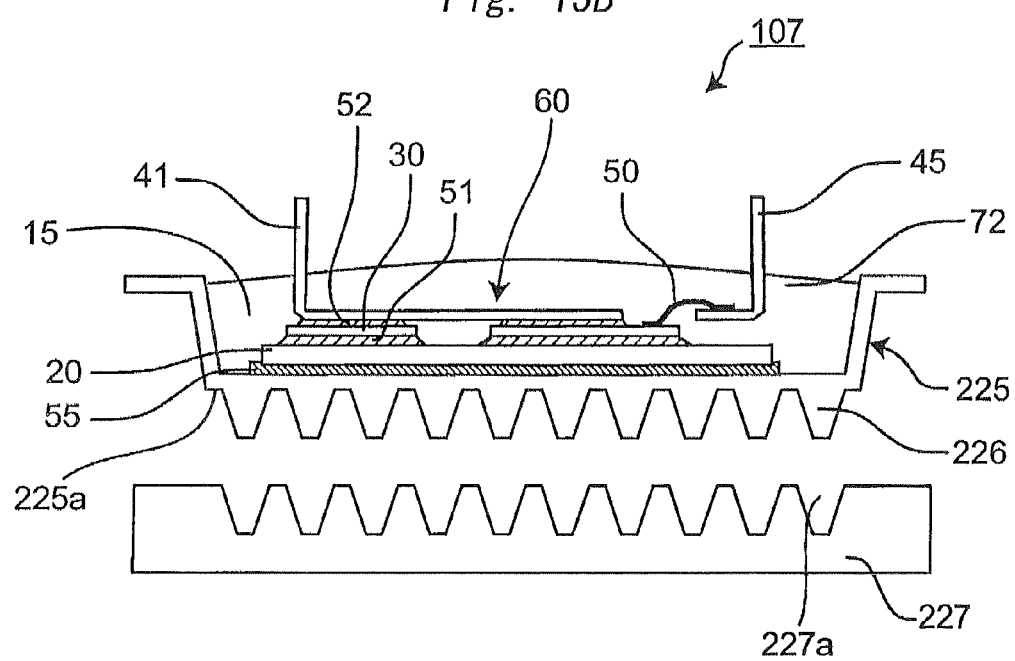
FIG. 14A is a view illustrating an example of the structure of a semiconductor device according to a seventh embodiment of the present invention.

As illustrated in FIG. 14A, the metal tray 225 has protrusions 226 forming a wave-type concave-and-convex shape, for example on a cooling-device surface 225a which is positioned in the opposite side from the accommodating part 15 and is faced to a cooling device. Further, there is provided the cooling device 227 having a concave-and-convex portion 227a, which conforms to and engages with the protrusions 226. The tray 225 and the cooling device 227 are fastened to each other by engaging the protrusions 226 in the tray 225 with the concave-and-convex portion 227a in the cooling device 227 and, further, by swaging the cooling device 227, for example. Through this fastening, it is possible to attain fastening and heat dissipation similar to those attained by soldering. Therefore, it is possible to provide the effect of preventing damages of the structural portions in the semiconductor device and degradations of the quality of the semiconductor device, similarly to in the aforementioned respective embodiments.

Figure 14B:
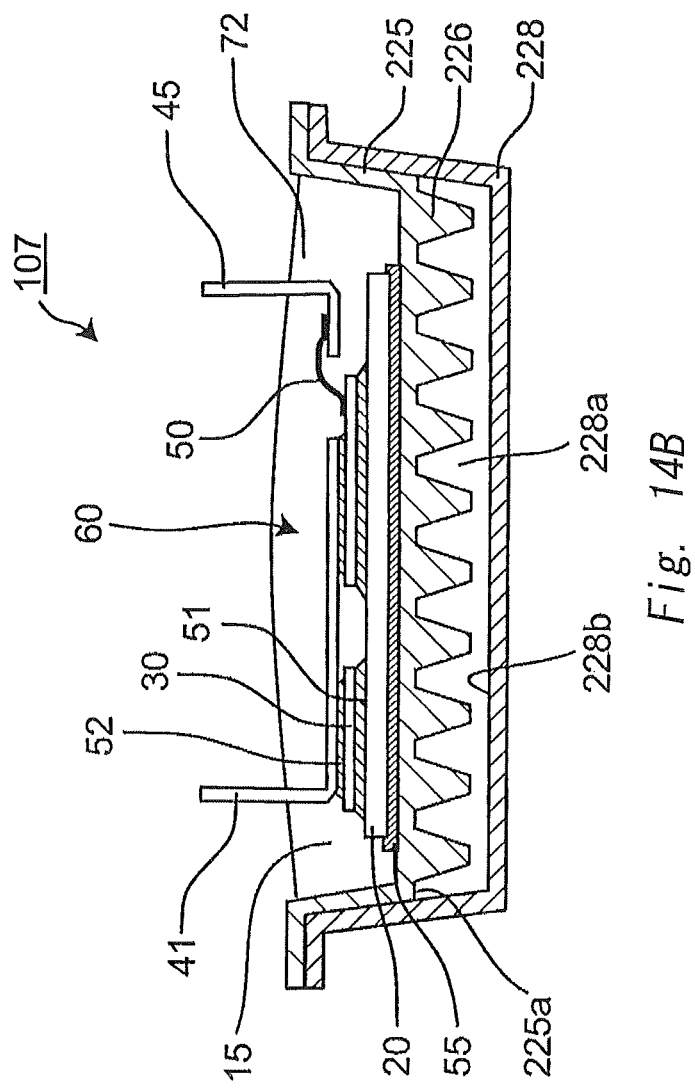
FIG. 14B is a view illustrating another example of the structure of the semiconductor device according to the seventh embodiment of the present invention.

Further, as a cooling device, as illustrated in FIG. 14B, it is possible to form a refrigerant path 228a for flowing a refrigerant therethrough using a jacket 228 which can be bonded to the tray 225 in such a way as to prevent leakages of the refrigerant. As the refrigerant, it is possible to employ water, for example. With this structure, the protrusions 226 in the tray 225 are positioned within the refrigerant path 228a and, thus, are caused to function as cooling fins, which can further enhance the cooling of the circuit part 60. As described above, with the semiconductor device 107 according to the seventh embodiment, it is possible to form the semiconductor device integrally with the cooling device.

Further, arbitrary embodiments out of the aforementioned various embodiments can be properly combined, which can provide the effects of the respective embodiments.

Although the present invention has been sufficiently described with respect to preferable embodiments with reference to the accompanying drawings, various changes and modifications will be apparent to those skilled in the art. It should be understood that the present invention encompasses such changes and modifications as falling within the scope of the present invention which is defined by the appended claims.

Further, Japanese Patent Application No. 2012-65161, filed on Mar. 22, 2012, is incorporated herein by reference in the entirety of the disclosures of the specification, the drawings, the claims and the abstract.

Description of Reference Signs
- 10, 10-2: Tray
- 10a: Top part
- 11: Bottom surface
- 12: Low side wall
- 13: High side wall
- 15: Accommodating part
- 17: Protrusion
- 18: Cutting portion
- 30: Diode
- 31: IGBT
- 40: Bus bar
- 41, 43: External electrode
- 55: Insulation sheet
- 60: Circuit part
- 70: Sealing resin
- 72: Potting sealing resin
- 80: Lead frame
- 91: First direction
- 92: Second direction
- 101 to 107: Semiconductor device
- 210: Base plate
- 211: Claw member
- 212: Metal substrate
- 216: Side wall
- 221, 222a: Fixing portion
- 226: Protrusion
- 227: Cooling device
- 227a: Concave-and-convex portion
- 228: Jacket
- 228a: Refrigerant path
- 228b: Bottom surface
- 231: Electrode supporting member

The invention claimed is:

1. A semiconductor device comprising:
a tray configured to have an accommodating part with a concave shape such that the accommodating part opens in an upward direction relative to the tray;
a circuit part configured to be housed in the accommodating part and have a semiconductor element and wiring members; and
a sealing resin configured to be injected in the accommodating part and seal, in potting, the circuit part housed in the accommodating part and side wall top parts of the tray,
the wiring members being partially exposed out of a top surface of the sealing resin, the top surface facing in the upward direction, to form external electrodes, and
the sealing resin having a heat resistant temperature which is higher than the melting point of a solder for bonding the tray to a cooling device.

2. The semiconductor device according to claim 1, wherein a side wall of the tray, close to a power electrode adapted to treat a higher voltage and a larger electric current out of the external electrodes, has a smaller height than those of the other side walls of the tray.

3. The semiconductor device according to claim 1, wherein the tray has high side walls and low side walls forming the accommodating part,
the high side walls are configured to have a length in which plural sets of the circuit parts are housed in the tray in a row along a first direction of the tray, and
the low side walls are configured to be placed at a plurality of positions in the first direction in such a way as to oppose each other and be adapted to form cutting portions for dividing the respective circuit parts which have been potting-sealed, into individual parts.

4. The semiconductor device according to claim 1, further comprising:
a lead frame configured to be mountable to the tray and be formed integrally with the wiring members including the external electrodes,
wherein the sealing resin is injected into the accommodating part in a state where the lead frame is mounted to the tray.

5. The semiconductor device according to claim 1, wherein the tray further has a tubular-shaped protrusion in a bottom surface of the accommodating part.

6. The semiconductor device according to claim 1, further comprising
an electrode supporting member configured to be mounted to a side wall top part of the tray and be adapted to support the external electrodes.

7. The semiconductor device according to claim 1, wherein the tray has a base plate made of a metal, an insulation sheet placed on the base plate and provided with a metal substrate, and a claw member made of a metal configured to fix the placed insulation sheet to the base plate, and the base plate is shaped in a concave shape.

8. The semiconductor device according to claim 1, wherein the tray has a side wall configured to be folded after the sealing resin is injected into the accommodating part.

9. The semiconductor device according to claim 1, wherein the tray further has a fixing portion configured to be formed in an upper portion of the tray and be adapted to fix the circuit part housed in the accommodating part.

10. A semiconductor device comprising:
a tray configured to have an accommodating part with a concave shape such that the accommodating part opens in an upward direction relative to the tray;
a circuit part configured to be housed in the accommodating part and have a semiconductor element and wiring members; and
a sealing resin configured to be injected in the accommodating part and seal, in potting, the circuit part housed in the accommodating part and side wall top parts of the tray; and a cooling device mounted to the tray, the wiring members being partially exposed out of a top surface of the sealing resin, the top surface facing in the upward direction, to form external electrodes, and the tray having a protrusion on a cooling-device surface faced to the cooling device.

11. The semiconductor device according to claim 10, wherein the cooling device has a concave-and-convex portion to engage with the protrusion in the tray, and the cooling device is mounted to the tray by engaging the protrusion with the concave-and-convex portion.

12. The semiconductor device according to claim 10, wherein the cooling device has a jacket shape configured to have a bottom surface forming a refrigerant path between the cooling device and the cooling-device surface of the tray.

* * * * *